(12) United States Patent
Benwadih et al.

(10) Patent No.: US 9,761,653 B2
(45) Date of Patent: Sep. 12, 2017

(54) ELECTRONIC DEVICE INCLUDING AN ORGANIC OPTOELECTRONIC COMPONENT AND AN ORGANIC TRANSISTOR

(71) Applicants: Commissariat à l'Énergie Atomique et aux Énergies Alternatives, Paris (FR); ISORG, Grenoble (FR)

(72) Inventors: Mohammed Benwadih, Champigny sur Marne (FR); Jean-Marie Verilhac, Grenoble (FR)

(73) Assignees: Commissariat à l'Énergie Atomique et aux Énergies Alternatives, Paris (FR); ISORG, Grenoble (FR)

( * ) Notice: Subject to any disclaimer, the term of this patent is extended or adjusted under 35 U.S.C. 154(b) by 0 days.

(21) Appl. No.: 15/121,584

(22) PCT Filed: Feb. 25, 2015

(86) PCT No.: PCT/EP2015/053938
§ 371 (c)(1),
(2) Date: Aug. 25, 2016

(87) PCT Pub. No.: WO2015/128380
PCT Pub. Date: Sep. 3, 2015

(65) Prior Publication Data
US 2016/0365403 A1    Dec. 15, 2016

(30) Foreign Application Priority Data
Feb. 25, 2014    (FR) ...................................... 14 51508

(51) Int. Cl.
*H01L 27/32*    (2006.01)
*H01L 27/30*    (2006.01)

(52) U.S. Cl.
CPC ...... *H01L 27/3274* (2013.01); *H01L 27/3258* (2013.01); *H01L 27/3262* (2013.01); *H01L 27/307* (2013.01)

(58) Field of Classification Search
CPC ............. H01L 27/3274; H01L 27/3262; H01L 27/3258
See application file for complete search history.

(56) References Cited

U.S. PATENT DOCUMENTS

| 8,445,901 B2 | 5/2013 | Maekawa |
| 2004/0041146 A1 | 3/2004 | Cheng et al. |
| (Continued) | | |

FOREIGN PATENT DOCUMENTS

EP    2472583 A2    7/2012

OTHER PUBLICATIONS

International Search Report, dated Apr. 20, 2015, from corresponding International Application No. PCT/EP2015/053938.
(Continued)

*Primary Examiner* — Douglas Menz
(74) *Attorney, Agent, or Firm* — Wolf, Greenfield & Sacks, P.C.

(57) ABSTRACT

An electronic device which includes at least one optoelectronic component including a first active layer, a first electrode, and a second interface layer between the first layer and the first electrode; and at least one first field effect transistor including a first semiconductor portion, a first gate, and at least one third layer, between the first gate and the first semiconductor portion. The third layer is made of the same material as the second layer. The electronic device includes a second electrode and a fourth interface layer between the first layer and the second electrode and includes a second field effect transistor that includes a second semiconductor portion, a second gate, and at least one fifth layer
(Continued)

between the second gate and the second semiconductor portion. The fifth layer is made of the same material as the fourth layer.

12 Claims, 3 Drawing Sheets

(56) References Cited

U.S. PATENT DOCUMENTS

2008/0124569 A1  5/2008  Kathirgamanathan et al.
2009/0159875 A1  6/2009  Chabinyc et al.

OTHER PUBLICATIONS

International Preliminary Report on Patentability, dated May 4, 2016, from corresponding International Application No. PCT/EP2015/053938.

ELECTRONIC DEVICE INCLUDING AN ORGANIC OPTOELECTRONIC COMPONENT AND AN ORGANIC TRANSISTOR

CROSS-REFERENCE TO RELATED APPLICATIONS

This application is the national phase of International Application No. PCT/EP2015/053938, filed on Feb. 25, 2015, which claims priority to French patent application 14/51508, filed on Feb. 25, 2014, both of which applications are hereby incorporated by reference to the maximum extent allowable by law.

BACKGROUND

The present description relates to electronic devices at least partly made of organic materials, and to electronic device comprising at least one organic optoelectronic component and one organic field-effect transistor.

DISCUSSION OF THE RELATED ARTS

An electronic device such as a display screen or an image sensor may comprise an array of organic optoelectronic components, for example, organic photodiodes (OPD) or organic light-emitting diodes (OLED), associated with organic field-effect transistors (OFET).

It is known to form organic optoelectronic components on a first support, to form organic field-effect transistors on a second support, and to place the first support on the second support to connect the field-effect transistors to the optoelectronic components.

It would however be desirable to be able to directly form, on a same support, both the organic optoelectronic components and the organic transistors. A difficulty is that organic material are fragile, so that the organic optoelectronic component manufacturing steps may cause a degradation of the transistors, or conversely, when these components are successively formed on a same support. As an example, a layer of an organic material which has already been deposited may in particular be deteriorated by the solvent used for the subsequent deposition of a layer of another organic material.

SUMMARY

An embodiment aims at overcoming all or part of the disadvantages of electronic devices comprising optoelectronic components and field-effect transistors at least partly made of organic materials and of known methods of manufacturing such devices.

Another embodiment aims at forming the optoelectronic components and the field-effect transistors directly on the same support.

Another embodiment aims at improving the performance of the field-effect transistors of such electronic devices.

Thus, an embodiment provides an electronic device comprising at least one optoelectronic component comprising a first active layer, a first electrode, and a second interface layer between the first layer and the first electrode, and at least one first field-effect transistor comprising a first semiconductor portion and a first gate and at least one third layer between the first gate and the first semiconductor portion, the third layer being made of the same material as the second layer.

According to an embodiment, the device further comprises a fourth dielectric layer interposed between the third layer and the first gate.

According to an embodiment, the electric resistance of the third layer is greater than or equal to $10^9 \Omega/\square$.

According to an embodiment, the thickness of the third layer is in the range from 0.1 nm to 500 nm.

According to an embodiment, the first layer comprises at least one first organic material.

According to an embodiment, the first semiconductor portion comprises a second organic material.

According to an embodiment, the second layer comprises a material selected from among zinc oxide, titanium oxide, cesium carbonate, or a mixture of at least two of these compounds.

According to an embodiment, the third layer is an extension of the second layer.

According to an embodiment, the device comprises a second electrode and a fourth interface layer between the first layer and the second electrode and comprises a second field-effect transistor comprising a second semiconductor portion, a second gate, and at least one fifth layer between the second gate and the second semiconductor portion, the fifth layer being made of the same material as the fourth layer.

According to an embodiment, the fifth layer is an extension of the fourth layer.

According to an embodiment, the first transistor is of type N and the second transistor is of type P.

According to an embodiment, the device comprises a support, the first gate resting on a surface of the support.

According to an embodiment, the device comprises a support having first and second opposite surfaces, the optoelectronic component being arranged on the first surface side and the first transistor being arranged on the second surface side.

BRIEF DESCRIPTION OF THE DRAWINGS

The foregoing and other features and advantages will be discussed in detail in the following non-limiting description of specific embodiments in connection with the accompanying drawings, among which.

DETAILED DESCRIPTION

Figure 1:
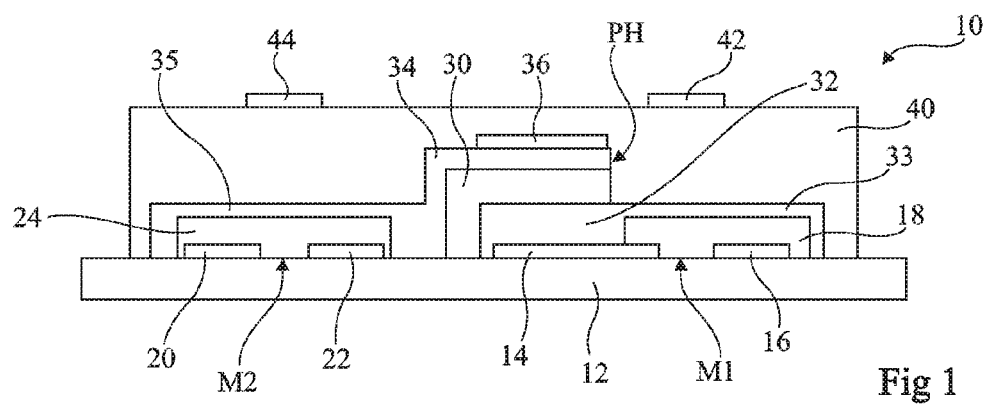
FIG. 1 is a partial simplified cross-section view of an embodiment of an optoelectronic device comprising an organic photodiode and an OFET transistor.

For clarity, the same elements have been designated with the same reference numerals in the various drawings and, further, as usual in the representation of electronic circuits, the various drawings are not to scale. Further, only those steps and elements which are useful to the understanding of the described embodiments have been shown and detailed. In particular, the electronic device biasing and control systems are well known by those skilled in the art and are not described. Further, in the following description, expressions "substantially", "around", and "approximately" mean "to within 10%".

In the following description, term organic electronic component, particularly for an optoelectronic component or a transistor, designates an electronic component having at least a portion thereof made of an organic material.

FIG. 1 shows an embodiment of an electronic device 10 comprising at least optoelectronic components and organic field-effect transistors. In the present embodiment, the optoelectronic component is a photodiode. However, the optoelectronic component may be any type of component capable of emitting an electromagnetic radiation, for example, a light-emitting diode, or of capturing an electromagnetic radiation. FIG. 1 shows a single photodiode PH associated with two field-effect transistors M1 and M2.

Optoelectronic device 10 comprises a support 12. Transistor M1 comprises two metal electrodes 14, 16 resting on support 12 and forming the power terminals of transistor M1, that is, the source and drain electrodes of transistor M1. Transistor M1 comprises a semiconductor portion 18 at least partially covering electrodes 14, 16 and extending on support 12 between electrodes 14, 16. As an example, semiconductor portion 18 is made of an organic material. As an example, semiconductor portion 18 favorably transports electrons. It is for example N-type doped. Transistor M2 comprises electrodes 20, 22 resting on support 12 and forming the power terminals of transistor M2. Transistor M2 further comprises a semiconductor portion 24 at least partially covering electrodes 20, 22 and extending on support 12 between electrodes 20, 22. As an example, semiconductor portion 24 is made of an organic material. As an example, semiconductor portion 24 favorably transports holes. It is for example P-type doped.

Photodiode PH comprises an active layer 30 interposed between two interface layers 32, 34. Interface layer 32 at least partially covers electrode 14, which also forms a first electrode of photodiode PH, for example, the cathode. A conductive portion 36 covers interface layer 34. Conductive portion 36 forms the second electrode of photodiode PH, for example, the anode.

In the present embodiment, advantageously, interface layer 32 comprises a portion 33 which covers semiconductor portion 18, and interface layer 34 comprises a portion 35 which covers semiconductor portion 24.

Device 10 comprises a dielectric layer 40, which covers the entire structure, particularly, at the same time, interface layer 34, electrode 36, and interface layer 32. The stack comprising portion 33 of interface layer 32 covering semiconductor portion 18 and the portion of dielectric layer 40 covering portion 33 plays the role of a gate oxide for transistor M1. The stack comprising portion 35 of interface layer 34 covering semiconductor portion 24 and the portion of dielectric layer 40 covering portion 35 plays the role of a gate oxide for transistor M2. Device 10 further comprises conductive portions 42, 44 on dielectric layer 40. Conductive portion 42 corresponds to the gate of transistor M1 and conductive portion 44 corresponds to the gate of transistor M2.

Interface layer 32 enables to align the work function of electrode 14 with the electronic affinity of the acceptor material used in active layer 30 and interface layer 34 enables to align the work function of electrode 36 with the ionization potential of the donor used in active layer 30. According to the diode biasing mode, interface layers 32, 34 ease the collection, the injection, or the blocking of charges from electrodes 14, 36 in active layer 30. The thickness of interface layers 32, 34 is preferably in the range from 0.1 nm to 500 nm. Preferably, interface layers 32, 34 have an electric resistance greater than 109Ω/□, preferably greater than or equal to 1012Ω/□. The high electric resistance of interface layers 32, 34 enables to avoid the forming of a short-circuit with semiconductor portions 24, 18.

The portion 33 of interface layer 32 which is interposed between semiconductor portion 18 and dielectric layer 40 protects semiconductor portion 18 on manufacturing of the rest of device 10. Interface layer 34, which is interposed between semiconductor portion 24 and dielectric layer 40, enables to protect semiconductor portion 24 on manufacturing of the rest of device 10. Further, interface layers 32, 34 enable to decrease the thickness of dielectric layer 40. They may also enable to protect semiconductor layers 18 and 24 from a possible re-solution in the solvent(s) of dielectric layer 40.

When device 10 is intended to be illuminated through support 12, that is, from the bottom in FIG. 1, support 12, electrode 14, and interface layer 32 are preferably at least partially transparent. When device 10 is intended to be illuminated through dielectric layer 40, that is, from the top in FIG. 1, electrode 36, dielectric layer 40 and interface layer 34 are preferably at least partially transparent.

In the embodiment shown in FIG. 1, a power terminal of transistor M1 is common with an electrode of photodiode PH. As a variation, a power terminal of transistor M2 may be common with an electrode of photodiode PH or none of the power terminals of transistors M1 and M2 is common with an electrode of photodiode PH.

Support 12 is for example a rigid support, particularly made of glass, or a flexible support, for example, made of polymer or of a metallic material. Examples of polymer are polyethylene naphthalene (PEN), polyethylene terephthalate (PET), kapton, or polyetheretherketone (PEEK). The thickness of support 12 is for example in the range from 20 μm to 1 cm, for example, approximately 125 μm.

Electrodes 14, 16, 20, 22 may be made of transparent conducting oxide (TCO), of carbon nanotubes, of graphene, of a conducting polymer, of a metal or of a mixture or an alloy of at least two of these compounds.

Examples of TCO capable of forming electrodes 14, 16, 20, 22, 36, 42, 44 are indium tin oxide (ITO), aluminum zinc oxide (AZO), and gallium zinc oxide (GZO). Examples of conductive polymers capable of forming electrodes are the polymer known as PEDOT:PSS, which is a mixture of poly(3,4)-ethylenedioxythiophene and of sodium poly(styrene sulfonate), or polyaniline, also called PAni. Examples of metals capable of forming electrodes are silver (Ag), gold (Au), copper (Cu), nickel (Ni), titanium (Ti), chromium (Cr). An example of a multilayer structure capable of forming electrodes is a multilayer AZO and silver structure of AZO/Ag/AZO type. The thickness of electrodes 14, 16, 20, 22 may be in the range from 10 nm to 5 μm, for example, in the order of 30 nm. The layers may be deposited by a vacuum deposition method (evaporation, sputtering . . . ), a liquid deposition method (sol-gel, dispersions, nanoparticles . . . ) or any other type of deposition method. In the case where an electrode 14, 16, 20, 22, 36, 42, 44 is metallic and should be at least partially transparent, the electrode thickness is smaller than or equal to 20 nm, preferably smaller than or equal to 10 nm.

Semiconductor portion 18 which corresponds to an electron transport channel is, for example, made of naphthalene, of perylene diimide, of copper phthalocyanine, or of thiophene comprising perfluorinated lateral chains or fluoro groups or cyano groups on the aromatic cycles. As an example, semiconductor portion 18 is made of perylene diimide, particularly PDI8-CN2. The thickness of semiconductor portion 18 may be in the range from 1 nm to 1 μm, for example, in the order of 90 nm.

Semiconductor portion 24, which corresponds to a hole transport channel, may be a semiconductor polymer, small organic molecules, carbon nanowires or nanotubes, or TCO.

Examples of P-type doped semiconductor polymers capable of forming semiconductor portion 24 are poly(9,9-dioctylfluorene-co-N-(4-butylphenyl)diphenylamine (TFD) and poly(triaryl amine) (PTAA). Examples of small organic molecules capable of forming semiconductor portion 24 are 6,13-Bis(triisopropylsilylethynyl) pentacene (TIPS pentacene). Examples of TCO capable of forming semiconductor portion 24 are an indium-gallium-zinc oxide (IGZO), an indium zinc oxide (IZO), or indium oxide (In2O3).

Active layer 30 may comprise small molecules, oligomers, or polymers. These may be organic or inorganic materials. Active layer 30 may comprise an ambipolar semiconductor material, or a mixture of an N-type semiconductor material and of a P-type semiconductor material, for example in the form of stacked layers or of an intimate mixture at a nanometer scale to form a bulk heterojunction. The thickness of active layer 30 may be in the range from 50 nm to 500 nm, for example, in the order of 200 nm.

Example of P-type semiconductor polymers capable of forming active layer 30 are poly(3-hexylthiophene) (P3HT), poly[N-9'-heptadecanyl-2,7-carbazole-alt-5,5-(4,7-di-2-thienyl-2',1',3'-benzothiadiazole] (PCDTBT), Poly[(4,8-bis-(2-ethylhexyloxy)-benzo[1,2-b;4,5-b']dithiophene)-2,6-diyl-alt-(4-(2-ethylhexanoyl)-thie-no[3,4-b]thiophene))-2,6-diyl];4,5-b']dithiophene)-2,6-diyl-alt-(5,5'-bis(2-thienyl)-4,4,-dinonyl-2,2'-bithiazole)-5',5"-diyl] (PBDTTT-C), le poly [2-methoxy-5-(2-ethyl-hexyloxy)-1,4-phenylene-vinylene] (MEH-PPV) or Poly[2,6-(4,4-bis-(2-ethylhexyl)-4H-cyclopenta [2,1-b;3,4-b'] dithiophene)-alt-4,7(2,1,3-benzothiadiazole)] (PCPDTBT).

Examples of N-type semiconductor materials capable of forming active layer 30 are fullerenes, particularly C60, [6,6]-phenyl-C61-butyric acid methyl ester ([60]PCBM), [6,6]-phenyl-C71-butyric acid methyl ester ([70]PCBM), perylene diimide, zinc oxide (ZnO), or nanocrystals enabling to form quantum dots.

Interface layer 32 may be made of zinc oxide (ZnO), of cesium carbonate (CSCO3), or of a mixture of at least two of these compounds. Interface layer 32 is preferably made of a metal oxide, more preferably of zinc oxide. Interface layer 32 may comprise a self-assembled monomolecular layer or a polymer, for example, (polyethyleneimine, ethoxylated polyethyleneimine, poly[(9,9-bis(3'-(N,N-dimethylamino) propyl)-2,7-fluorene)-alt-2,7-(9,9-dioctylfluorene)].

Interface layer 34 may be made of copper oxide (CuO), of nickel oxide (NiO), of vanadium oxide (V2O5), of magnesium oxide (MgO), of tungsten oxide (WO3), or of a mixture of at least two of these compounds.

Dielectric layer 40 may be made of a fluorinated polymer, particularly the fluorinated polymer commercialized under trade name Cytop by Bellex, of polyvinylpyrrolidone (PVP), of polymethyl methacrylate (PMMA), of polystyrene (PS), of parylene, of polyimide (PI), or of a mixture of at least two of these compounds. The thickness of the dielectric layer at the level of each transistor M1, M2 may be in the range from 50 nm to 2 μm, for example, in the order of 200 nm.

Figure 2:
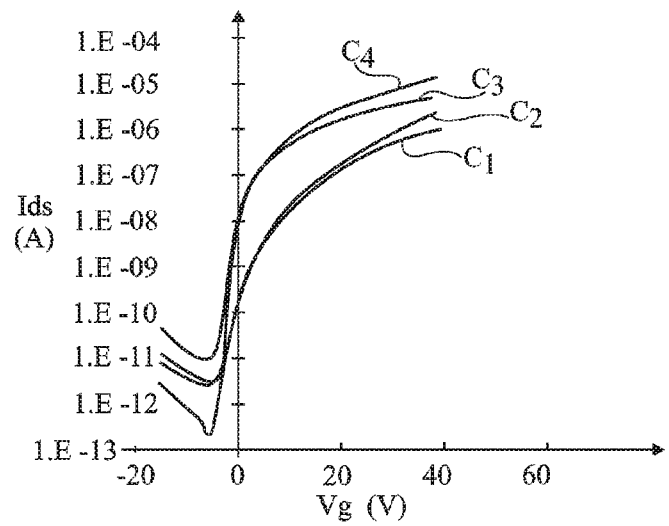
FIG. 2 shows curves of the variation of the gate voltage according to the current between the drain and the source of the OFET transistor of the electronic device shown in FIG. 1 and of a known OFET transistor.

FIG. 2 shows curves C1 to C4 of variation of the current between the drain and the source flowing through transistor M1 according to the gate voltage for a test where interface layer 32 is not interposed between semiconductor portion 18 and dielectric layer 40 (curves C1 and C2) and for a test where interface layer 32 is interposed between semiconductor portion 18 and dielectric layer 40 (curves C3 and C4). Curves C1 and C3 have been obtained with a −5-V drain-source voltage and curves C2 and C4 have been obtained with a −40-V drain-source voltage. The tests have be performed with a transistor M1 for which support 12 is made of PEN, electrodes 14 and 16 are made of gold and have a 30-nm thickness, semiconductor portion 18 is made of perylene diimide and has a 90-nm thickness, interface layer 32 is made of ZnO and has a 30-nm thickness, active layer 30 is a mixture of P3HT and C60 and has a 200-nm thickness, interface layer 34 is made of PEDOT:PSS and has a 300-nm thickness, dielectric layer 40 is made of Cytop dielectric and has a 700-nm thickness, and electrodes 42, 44 are made of silver and have a 100-nm thickness.

Interface layer 32 has enabled to improve the conduction of transistor M1. Further, interface layer 32 has enabled to increase the slope of the curve at the transition from the on state to the off state of the transistor for curves C3 and C4 as compared with curves C1 and C2. This reflects a decrease in the number of interface traps at the external surface of semiconductor portion 18 when portion 33 of interface layer 32 is present.

Figure 3A:
FIGS. 3A to 3H are partial simplified cross-section views of structures obtained at successive steps of an embodiment of a method of manufacturing the optoelectronic device shown in FIG. 1.

FIGS. 3A to 3H illustrate an embodiment of a method of manufacturing device 10 comprising the steps of:

Forming electrodes 14, 16, 20, 22 on support 12 (FIG. 3A). According to the material used, the method of forming electrodes 14, 16, 20, 22 may correspond to a so-called additive process, for example, by direct printing of the material forming electrodes 14, 16, 20, 22 at the desired locations, particularly in sol-gel form, for example, by inkjet printing, photogravure, silk-screening, flexography, spray coating, or drop casting. The method of forming electrodes 14, 16, 20, 22 may correspond to a so-called subtractive process, where the material forming electrodes 14, 16, 20, 22 is deposited over the entire structure and where the non-used portions are then removed, for example, by photolithography or laser ablation. According to the considered material, the deposition over the entire structure may be performed, for example, by liquid deposition, by cathode sputtering, or by evaporation. Methods such as spin coating, spray coating, heliography, slot-die coating, blade coating, flexography, or silk-screening, may in particular be used. When electrodes 14, 16, 20, 22 are metallic, the metal is for example deposited by evaporation or by cathode sputtering over the entire support 12 and electrodes 14, 16, 20, 22 are delimited by etching.

Figure 3B:
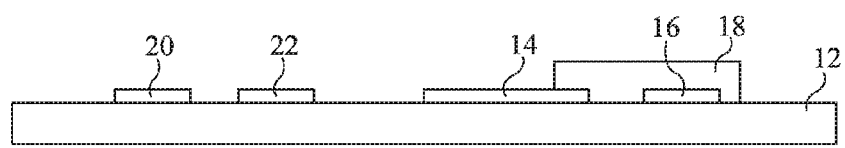
Figure 3C:
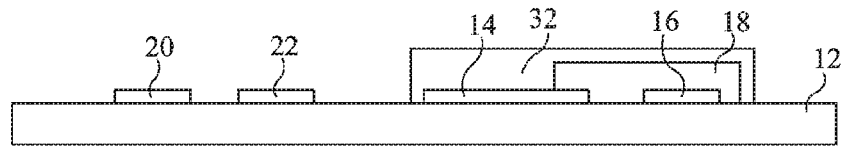
Figure 3D:
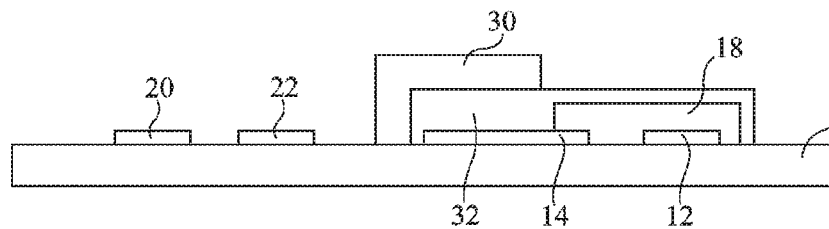
Figure 3E:
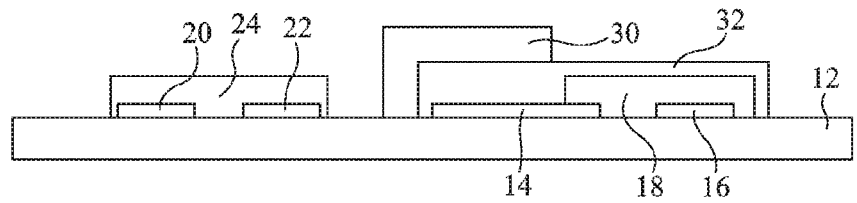
Figure 3F:
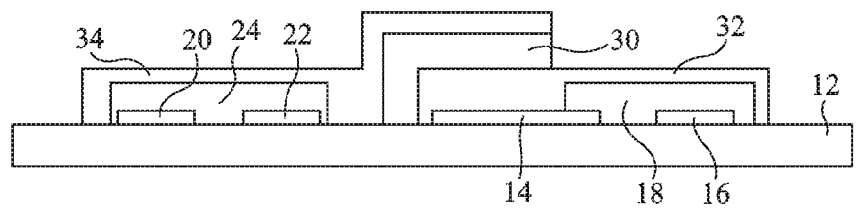
Figure 3G:
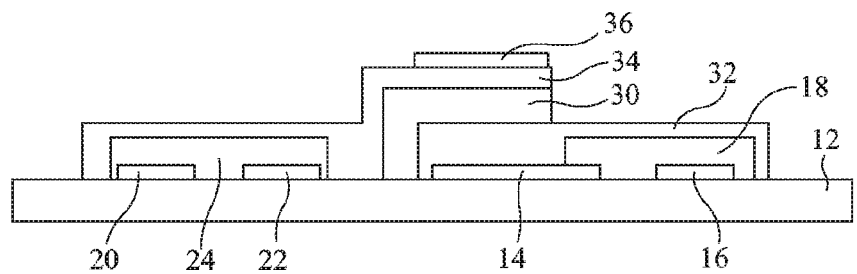
Figure 3H:
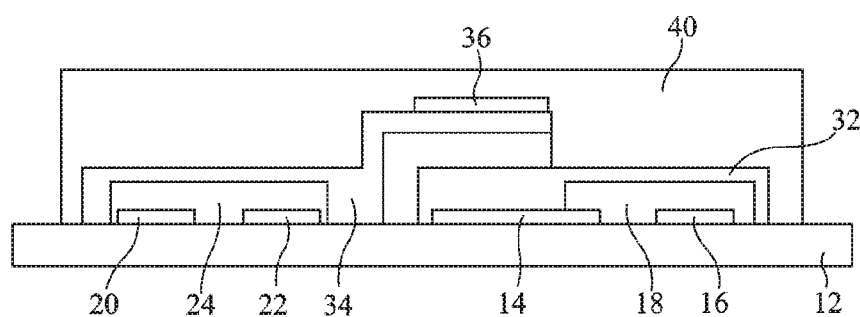

Forming semiconductor portion 18 (FIG. 3B).
Forming interface layer 32 (FIG. 3C).
Forming active layer 30 (FIG. 3D).
Forming semiconductor portion 24 (FIG. 3E).
Forming interface layer 34 (FIG. 3F).
Forming electrode 36 (FIG. 3G).
Forming dielectric layer 40 (FIG. 3H).
Forming electrodes 42 and 44.

Interface layer 32, active layer 30, interface layer 34, dielectric layer 40, and electrodes 36, 42, 43 may be formed, according to the materials used, according to all or part of the methods previously described for the forming of electrodes 14, 16, 20, 22.

When interface layer 32 is deposited in nanoparticle solution or sol-gel form, the solvent of the material of interface layer 32 is selected to avoid dissolving the material of semiconductor portion 18. When interface layer 32 is made of metal oxide, a wide range of solvents is available for the metal oxide, where the organic material of semiconductor portion 18 does not dissolve, for example, a water-, alcohol-based solvent (particularly ethanol, isopropanol, butanol), acetone, acetyl ethyl, acetyl methyl, or butyl acetate.

According to a variation, semiconductor portion 24 may be formed after interface layer 32 and before active layer 30. In this case, portion 35 of interface layer 34 covering semiconductor portion 24 is formed before active layer 30 and the rest of interface layer 34 is formed after active layer 30.

In the case where semiconductor portion 18 or 24 is formed by a subtractive method where a layer of the material of the semiconductor portion is deposited over the entire structure and is then etched, interface layer 32 may advantageously be used as a mask for the etching delimiting semiconductor portion 18. Since interface layer 32 is kept, a step of removing the etch mask of semiconductor portion 18, which causes a degradation of the external surface of semiconductor portion 18, is avoided.

Figure 4:
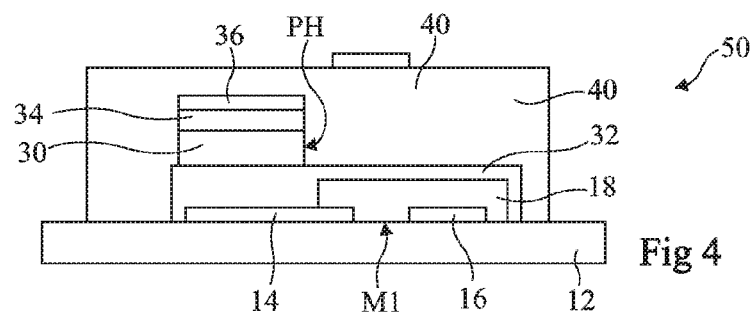
FIGS. 4 to 6 are partial simplified lateral cross-section views of other embodiments of an electronic device comprising an organic photodiode and an organic field-effect transistor.

FIG. 4 shows another embodiment of an electric device 50 which comprises all the components of optoelectronic device 10 shown in FIG. 1, with the difference that transistor M2 is not present.

Figure 5:
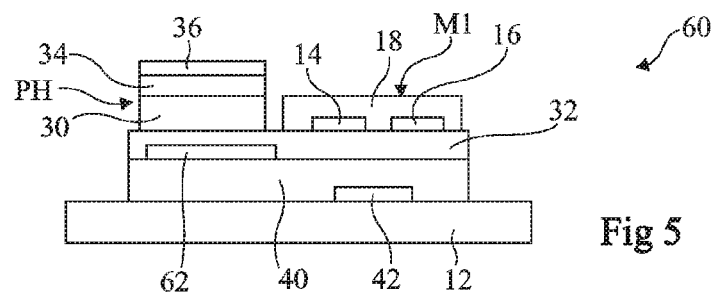

FIG. 5 shows another embodiment of an electric device 60 which shows all the elements of device 50 shown in FIG. 4, with the difference that the relative positions of the elements of transistor M1 are inverted. More specifically, in device 50, gate 42 of transistor M1 rests on support 12. Further, dielectric layer 40 forming the gate oxide of transistor M1 covers support 12 and gate electrode 62, and interface layer 32 covers dielectric layer 64 and electrode 66. Further, source and drain electrodes 14, 16 are formed on interface layer 32 and semiconductor portion 18 is formed on interface layer 68 and covers electrodes 14, 16. Device 50 further comprises a conductive portion 62 which is formed on dielectric layer 40 and forms the cathode of photodiode PH.

An advantage of device 60 is that it enables to use a thinner dielectric layer 40 than device 10 or 50.

Figure 6:
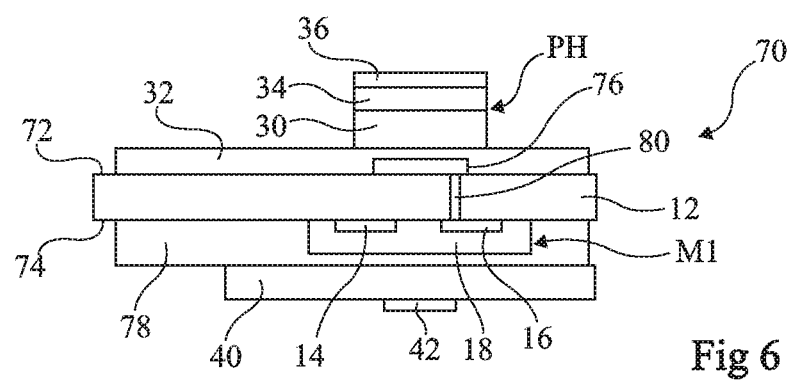

FIG. 6 shows another embodiment of an electronic device 70. In this embodiment, support 12 comprises two opposite surfaces 72, 74. Photodiode PH is formed on the side of surface 72 while transistor M1 is formed on the side of surface 74. Electronic device 70 comprises a conductive portion 76 on surface 72 forming the cathode of photodiode PH. Interface layer 32 covers electrode 76 and surface 72. The rest of photodiode PH has the same structure as that previously described in relation with FIG. 4 or 5.

An advantage of device 70 is that it has a smaller bulk than devices 10, 50, and 60. Further, transistor M1 may be better protected from light, particularly by support 12 and electrode 42.

The drain and source electrodes 14, 16 of transistor M1 are formed on surface 74. Semiconductor portion 18 covers electrodes 14, 16 and extends on surface 74 between electrodes 14, 16. A layer 78, made of the same material as interface layer 32, covers electrodes 14, 16 and semiconductor portion 18. Dielectric layer 40 covers layer 78 and gate electrode 42 of transistor M1 is formed on dielectric layer 40. In the present embodiment, electrode 16 of transistor M1 is connected to electrode 76 of photodiode PH by a conductive via 80 crossing support 12.

Figure 7A:
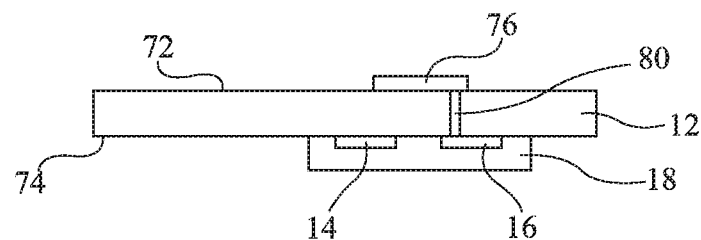
FIGS. 7A and 7B are partial simplified cross-section views of structures obtained at successive steps of another embodiment of a method of manufacturing the electronic device shown in FIG. 6.
Figure 7B:
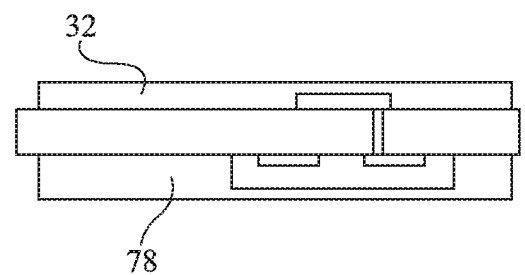

FIGS. 7A and 7B illustrate steps of an embodiment of a method of manufacturing electronic device 70.

FIG. 7A shows the structure obtained after having formed via 80 crossing support 12, electrode 76 on surface 72, and electrodes 14, 16 on surface 74 and after having formed semiconductor portion 18 on surface 74 of support 12.

FIG. 7B shows the structure obtained after having dipped the structure shown in FIG. 7A into a bath of the material forming interface layer 32, which is for example in sol-gel form, after having removed the structure from the bath, and after having dried the structure. Layers 32 and 78 are then obtained. The subsequent steps of the method comprise forming the remaining layers of photodiode PH and the remaining layers of transistor M1.

Specific embodiments have been described. Various alterations and modifications will occur to those skilled in the art. In particular, although in the previously-described embodiments, one or two field-effect transistors are associated with the optoelectronic component, it should be clear that more than two-field effect transistors may be associated with the optoelectronic component. Various embodiments with different variations have been described hereabove. It should be noted that those skilled in the art may combine various elements of these various embodiments and variations without showing any inventive step. In particular, in the structure of electronic device 70, one may provide, in addition to transistor M1, arranged on the side of support 12 opposite to photodiode PH, other transistors having the structure of the transistors of devices 10, 50, or 60.

The invention claimed is:

1. An electronic device comprising at least one optoelectronic component comprising a first active layer, a first electrode, and a second interface layer between the first layer and the first electrode and at least one first field-effect transistor comprising a first semiconductor portion and a first gate and at least one third layer between the first gate and the first semiconductor portion, the third layer being made of the same material as the second layer, the electronic device comprising a second electrode and a fourth interface layer between the first layer and the second electrode and comprising a second field-effect transistor comprising a second semiconductor portion a second gate and at least one fifth layer between the second gate and the second semiconductor portion, the fifth layer being made of the same material as the fourth layer.

2. The electronic device of claim 1, further comprising a fourth dielectric layer interposed between the third layer and the first gate.

3. The electronic device of claim 1, wherein the electric resistance of the third layer is greater than or equal to 109 Ω/□.

4. The electronic device of claim 1, wherein the thickness of the third layer is in the range from 0.1 nm to 500 nm.

5. The electronic device of claim 1, wherein the first layer comprises at least one first organic material.

6. The electronic device of claim 1, wherein the first semiconductor portion (18) comprises a second organic material.

7. The electronic device of claim 1, wherein the second layer comprises a material selected from zinc oxide, titanium oxide, cesium carbonate, or a mixture of at least two of these compounds.

8. The electronic device of claim 1, wherein the third layer is an extension of the second layer.

9. The electronic device of claim 1, wherein the fifth layer is an extension of the fourth layer.

10. The electronic device of claim 1, wherein the first transistor is of type N and the second transistor is of type P.

11. The electronic device of claim 1, comprising a support, the first gate resting on a surface of the support.

12. The electronic device of claim 1, comprising a support having first and second opposite surfaces, the optoelectronic component being arranged on the first surface side and the first transistor being arranged on the second surface side.

* * * * *